(12) United States Patent
Lin et al.

(10) Patent No.: US 8,659,126 B2
(45) Date of Patent: Feb. 25, 2014

(54) INTEGRATED CIRCUIT GROUND SHIELDING STRUCTURE

(75) Inventors: Yu-Ling Lin, Taipei (TW);
Hsiao-Tsung Yen, Tainan (TW);
Ho-Hsiang Chen, Hsinchu (TW);
Chewn-Pu Jou, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/313,240

(22) Filed: Dec. 7, 2011

(65) Prior Publication Data

US 2013/0147023 A1    Jun. 13, 2013

(51) Int. Cl.
*H01L 23/552*     (2006.01)

(52) U.S. Cl.
USPC .... 257/659; 257/531; 257/621; 257/E27.011; 257/E23.114

(58) Field of Classification Search
USPC .......... 257/531, 659, 621, E27.011, E23.114; 361/816, 799, 800, 818, 821
See application file for complete search history.

(56) References Cited

U.S. PATENT DOCUMENTS

| | | | |
|---|---|---|---|
| 5,391,917 A | | 2/1995 | Gilmour et al. |
| 5,446,311 A | * | 8/1995 | Ewen et al. .................... 257/531 |
| 5,510,298 A | | 4/1996 | Redwine |
| 5,767,001 A | | 6/1998 | Bertagnolli et al. |
| 5,831,331 A | * | 11/1998 | Lee ............................... 257/659 |
| 5,998,292 A | | 12/1999 | Black et al. |
| 6,091,318 A | * | 7/2000 | Lee et al. ....................... 338/309 |
| 6,184,060 B1 | | 2/2001 | Siniaguine |
| 6,322,903 B1 | | 11/2001 | Siniaguine et al. |
| 6,407,647 B1 | * | 6/2002 | Apel et al. ....................... 333/25 |
| 6,448,168 B1 | | 9/2002 | Rao et al. |
| 6,465,892 B1 | | 10/2002 | Suga |
| 6,472,293 B1 | | 10/2002 | Suga |
| 6,538,333 B2 | | 3/2003 | Kong |
| 6,599,778 B2 | | 7/2003 | Pogge et al. |
| 6,639,303 B2 | | 10/2003 | Siniaguine et al. |
| 6,664,129 B2 | | 12/2003 | Siniaguine et al. |
| 6,693,361 B1 | | 2/2004 | Siniaguine et al. |
| 6,740,582 B2 | | 5/2004 | Siniaguine |

(Continued)

OTHER PUBLICATIONS

Yue et al., Student Member, IEEE and S.Simon Wong, Senior Member, IEEE, On-Chip Spiral inductors with Patterned Ground Shields for Si-Based RF IC's.*

(Continued)

*Primary Examiner* — N Drew Richards
*Assistant Examiner* — Ankush Singal
(74) *Attorney, Agent, or Firm* — Haynes and Boone, LLP

(57) ABSTRACT

The present disclosure provides an Integrated Circuit (IC) device. The IC device includes a first die that contains an electronic component. The IC device includes second die that contains a ground shielding structure. The IC device includes a layer disposed between the first die and the second die. The layer couples the first die and the second die together. The present disclosure also involves a microelectronic device. The microelectronic device includes a first die that contains a plurality of first interconnect layers. An inductor coil structure is disposed in a subset of the first interconnect layers. The microelectronic device includes a second die that contains a plurality of second interconnect layers. A patterned ground shielding (PGS) structure is disposed in a subset of the second interconnect layers. The microelectronic device includes an underfill layer disposed between the first and second dies. The underfill layer contains one or more microbumps.

19 Claims, 10 Drawing Sheets

(56) References Cited

U.S. PATENT DOCUMENTS

| | | | |
|---|---|---|---|
| 6,777,774 B2* | 8/2004 | Beng et al. ............... 257/531 |
| 6,800,930 B2 | 10/2004 | Jackson et al. | |
| 6,815,739 B2* | 11/2004 | Huff et al. ............... 257/275 |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,154,161 B1* | 12/2006 | Blaschke et al. ............ 257/531 |
| 7,157,787 B2 | 1/2007 | Kim et al. | |
| 7,193,308 B2 | 3/2007 | Matsui | |
| 7,262,495 B2 | 8/2007 | Chen et al. | |
| 7,265,433 B2* | 9/2007 | Pillai et al. ............... 257/531 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,764,512 B2* | 7/2010 | Jow et al. ............... 361/799 |
| 8,159,013 B2* | 4/2012 | Nishimura et al. ........ 257/296 |
| 8,164,165 B2* | 4/2012 | Chang et al. ............ 257/621 |
| 8,227,892 B2* | 7/2012 | Chang ................. 257/531 |
| 2002/0113673 A1* | 8/2002 | Crescenzi et al. .......... 333/247 |
| 2003/0020173 A1* | 1/2003 | Huff et al. ............... 257/774 |
| 2003/0060035 A1* | 3/2003 | Kimura et al. ............ 438/626 |
| 2003/0096435 A1* | 5/2003 | Acosta et al. ............ 438/3 |
| 2006/0001821 A1* | 1/2006 | Dewa et al. .............. 349/150 |
| 2006/0049481 A1* | 3/2006 | Tiemeijer et al. .......... 257/531 |
| 2006/0056219 A1* | 3/2006 | Araki et al. ............. 365/63 |
| 2006/0157798 A1* | 7/2006 | Hayashi et al. ............ 257/374 |
| 2006/0202776 A1* | 9/2006 | Lee et al. ............... 333/25 |
| 2006/0232342 A1* | 10/2006 | Floyd et al. ............. 330/305 |
| 2007/0045812 A1* | 3/2007 | Heng ................... 257/693 |
| 2007/0194427 A1* | 8/2007 | Choi et al. ............. 257/686 |
| 2008/0020488 A1* | 1/2008 | Clevenger et al. ......... 438/3 |
| 2008/0290454 A1* | 11/2008 | Fujii .................. 257/529 |
| 2009/0085133 A1* | 4/2009 | Doan .................. 257/428 |
| 2009/0090995 A1* | 4/2009 | Yang et al. ............. 257/531 |
| 2009/0183358 A1* | 7/2009 | Jow et al. ............. 29/602.1 |
| 2009/0309234 A1* | 12/2009 | Knickerbocker et al. .... 257/774 |
| 2010/0193904 A1* | 8/2010 | Watt et al. ............. 257/531 |
| 2010/0226112 A1* | 9/2010 | Jow et al. .............. 361/818 |
| 2010/0320611 A1* | 12/2010 | Uchida et al. ........... 257/773 |
| 2011/0036912 A1* | 2/2011 | Guo et al. ............. 235/492 |
| 2011/0068433 A1* | 3/2011 | Kim et al. ............. 257/531 |
| 2011/0074536 A1* | 3/2011 | Coffy et al. ............ 336/200 |
| 2011/0133308 A1* | 6/2011 | Chan et al. ............ 257/531 |
| 2011/0304013 A1* | 12/2011 | Chen et al. ............ 257/531 |
| 2011/0316147 A1* | 12/2011 | Shih et al. ............ 257/737 |
| 2012/0280366 A1* | 11/2012 | Kamgaing et al. ........ 257/621 |

OTHER PUBLICATIONS

C. Patrick Yue et al., On-Chip Spiral Inductors with Patterned Ground Shields for Si-Based RF IC's, IEEE Journal of Solid-State Circuits, vol. 33, No. 5, May 1998, pp. 743-752.

* cited by examiner

INTEGRATED CIRCUIT GROUND SHIELDING STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This process may be referred to as a scaling down process.

Various active or passive electronic components can be formed on an IC chip. For example, inductors, resistors, capacitors, transistors, etc, may be formed on an IC chip. A shielding structure may also be implemented on the IC chip to provide isolation for devices such as inductors to reduce the harmful effects of noise and interference, particularly at high frequencies. However, traditional shielding structures may still lead to unwanted parasitic capacitance, which can lower the quality factor of devices such as inductors and otherwise degrade their performance. In addition, the parasitic capacitance issue may become exacerbated as the scaling down process continues.

Therefore, while existing shielding structures on ICs have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
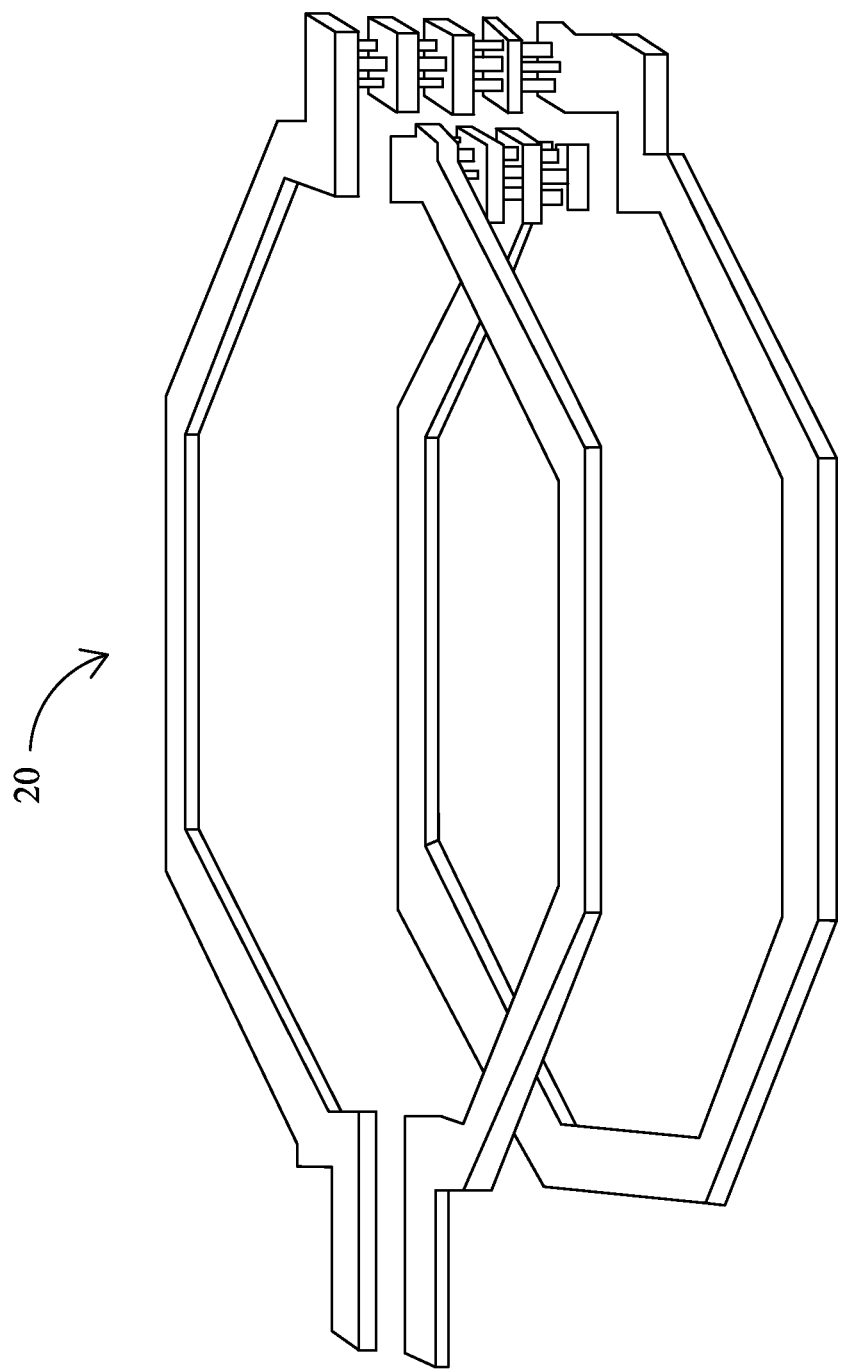
FIG. 1 is a perspective view of an example inductor device.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

During the course of Integrated Circuit (IC) fabrication evolution, electronic components (e.g., inductors, capacitors, resistors, transformers, etc) that used to be discrete components can now be formed as part of an IC chip. For example, an inductor may be formed by winding interconnect metal lines of an IC chip. To illustrate, FIG. 1 is a perspective view of an example inductor 20. The inductor 20 includes conductive elongate winding coils. When electric current flows through the conductive coils, a magnetic field is generated. The inductor 20 may be implemented in an interconnect structure having a plurality of interconnect layers, where each interconnect layer contains a plurality of metal lines separated by a dielectric material. In more detail, the elongate winding conductive coils of the inductor 20 may be implemented with the metal lines of one or more of the interconnect layers. The interconnect structure is formed on a substrate, which may contain a semiconductor material or another suitable material.

A shielding structure (not illustrated in FIG. 1) may be used to reduce the noise from neighboring components and to minimize the electromagnetic leakage of the inductor 20. For example, a shielding structure made up of a plurality of conductive lines may be implemented in an interconnect layer below the inductor 20. However, such shielding structure may lead to an undesirable parasitic capacitance for the inductor 20, as a capacitor is effectively formed by the inductor 20 (i.e., a conductor), the shielding structure (i.e., another conductor), and the dielectric material therebetween. This parasitic capacitance can lower a quality factor (Q) of the inductor 20 and affect the resonant frequency of a device containing the inductor 20 (e.g., an LC tank).

In accordance with various aspects of the present disclosure, the following paragraphs will describe a shielding structure that overcomes the parasitic capacitance issues discussed above.

Figure 2:
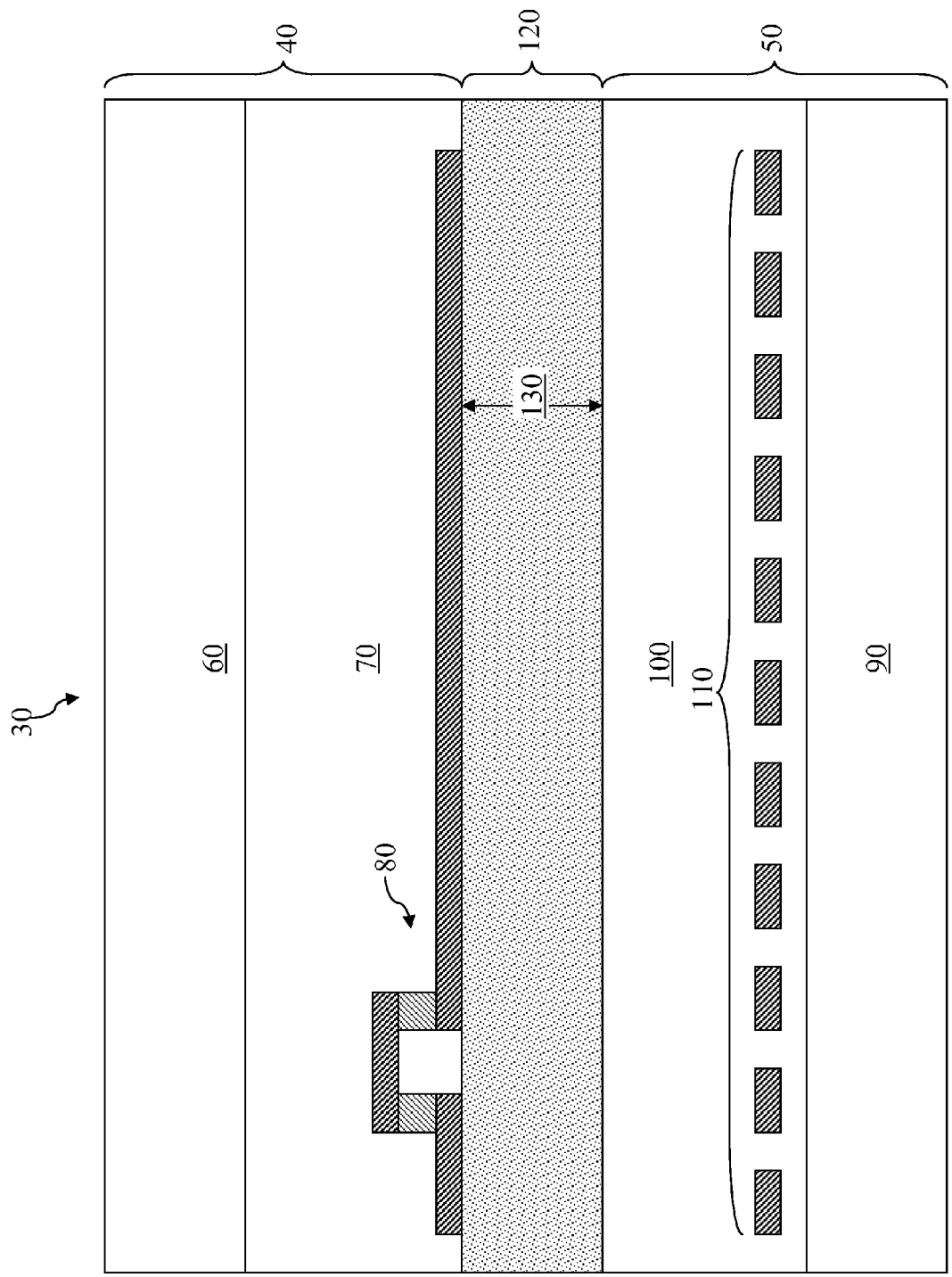
FIG. 2 is a cross-sectional view of an IC device according to various aspects of the present disclosure.

Referring to FIG. 2, a diagrammatic fragmentary cross-sectional side view of an IC device 30 is illustrated. The IC device 30 includes a die 40 and a die 50. In the embodiment illustrated in FIG. 2, the die 40 is an interposer die, and the die 50 is a silicon die manufactured according to a Complementary Metal Oxide Semiconductor (CMOS) fabrication process.

In more detail, the interposer die 40 includes a substrate 60 that may contain a dielectric material, a glass material, a high-resistance material, or another suitable non-conductive material. The interposer die 40 also includes an interconnect structure 70. The interconnect structure 70 includes a plurality of patterned interconnected conductive layers, which may also be referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof. The interconnect structure 70 also contains a plurality of vias/contacts that provide electrical connections between the different interconnect layers. In some embodiments, the substrate 60 and the interconnect structure 70 may be collectively considered as a single entity: that is, the substrate 60 may be considered a part of the interconnect structure 70. Or alternatively stated, the interconnect structure 70 is formed in the substrate 60, and there need not be a clear boundary between the interconnect structure 70 and the substrate 60.

An electronic component 80 is formed in the interconnect structure 70. For the sake of providing an example, the electronic component 80 includes an inductor structure in the embodiments illustrated herein and may be referred to as an inductor structure 80 thereafter. In other embodiments, however, the electronic component 80 may include other devices, such as transformers, resistors, capacitors, etc. The inductor structure 80 is formed by a subset of the metal lines and vias/contacts of the interconnect structure 70. In certain embodiments, the metal lines of the inductor structure 80 form a spiral-shaped coil (in a top view). The inductor structure 80 may span a plurality of metal layers.

The die 50 includes a substrate 90. In some embodiments, the substrate 90 is a silicon substrate doped with either a P-type dopant such as boron, or doped with an N-type dopant such as arsenic or phosphorous. The substrate 90 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 90 could include an epitaxial layer (epi layer), may be strained for performance enhancement, and may include a silicon-on-insulator (SOI) structure.

Although not specifically shown for the sake of simplicity, a plurality of electronic components may be formed in the substrate. For example, source and drain regions of Field Effect Transistor (FET) devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 40 and thereafter filling the recesses with a dielectric material, such as silicon oxide, silicon nitride, silicon oxy-nitride, fluoride-doped silicate (FSG), and/or a low-k dielectric material known in the art. For the sake of simplicity, the various electronic components formed in the substrate 90 are not specifically illustrated herein.

The die 50 includes an interconnect structure 100. The interconnect structure 100 includes a plurality of patterned dielectric layers and interconnected conductive layers. These interconnected conductive layers provide interconnections (e.g., wiring) between circuitries, inputs/outputs, and various doped features formed in the substrate 40. In more detail, the interconnect structure 100 may include a plurality of interconnect layers, also referred to as metal layers (e.g., M1, M2, M3, etc). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including PVD, CVD, sputtering, plating, or combinations thereof.

The interconnect structure 100 includes an interlayer dielectric (ILD) that provides isolation between the interconnect layers. The ILD may include a dielectric material such as an oxide material. The interconnect structure 100 also includes a plurality of vias/contacts that provide electrical connections between the different interconnect layers and/or the features on the substrate. For the sake of simplicity, the metal lines in the interconnect layers, the vias interconnecting the metal lines, and the dielectric material separating them are not specifically illustrated herein.

A shielding structure 110 is formed in the interconnect structure 100. In the illustrated embodiment, the shielding structure 110 includes a patterned ground shielding (PGS) structure. The shielding structure 110 is formed with patterned metal lines in the metal layers of the interconnect structure 100. The shielding structure 110 isolates the inductor structure 80 against electromagnetic interference from the microelectronic components in the substrate 90.

Figure 3:
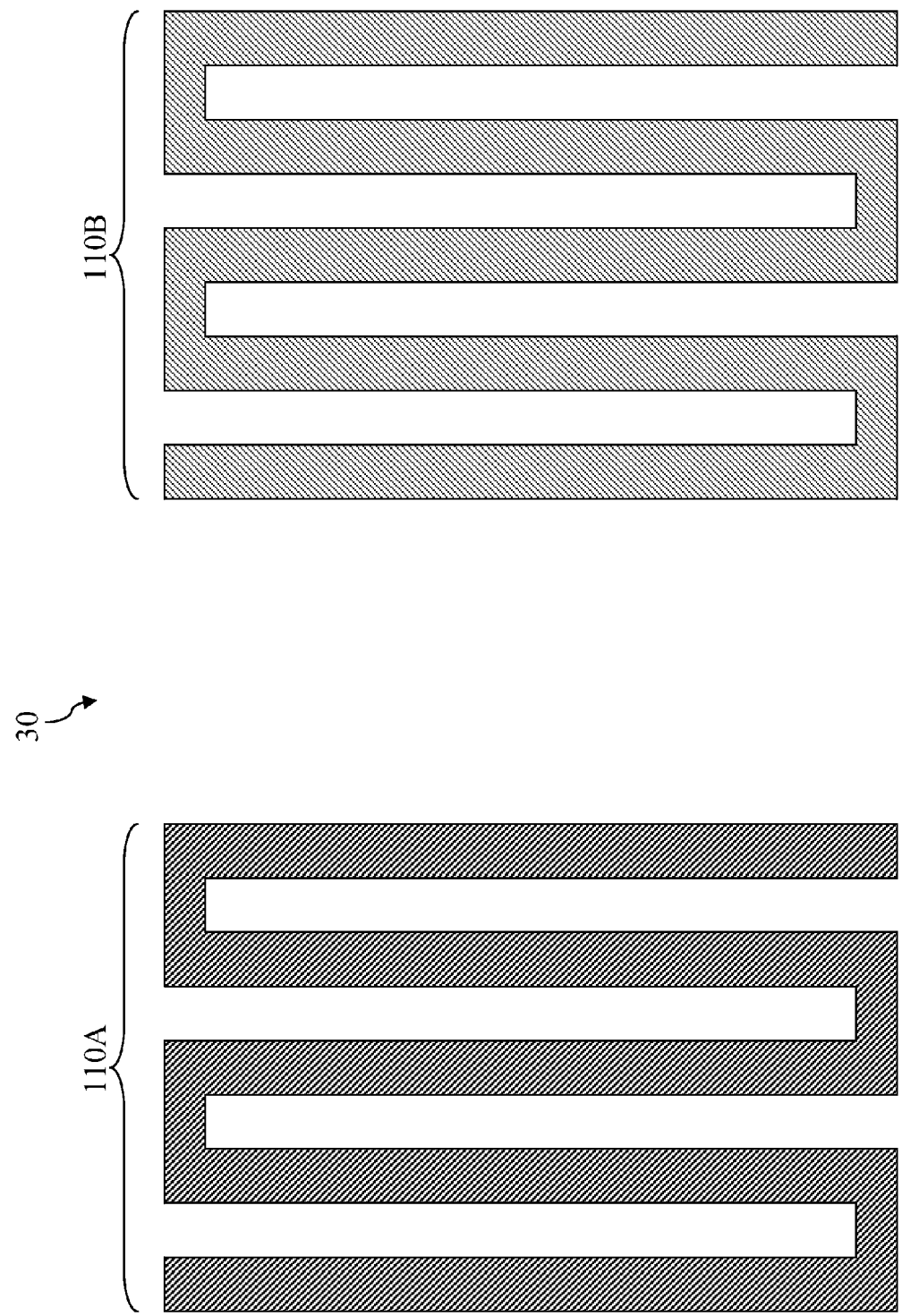
FIGS. 3A-3B and 4 are top views of a shielding structure according to various aspects of the present disclosure.

In some embodiments, the shielding structure 110 may include segments that belong to different layers, and the segments may have a meandrous or meandering shape. For example, FIG. 3A-3B illustrate diagrammatic fragmentary top views of two example segments 110A and 110B of the shielding structure 110, respectively. The segments 110A and 110B are metal lines from different metal layers of the interconnect structure 100. For example, the segment 110A may contain metal lines from a metal-1 layer, and the segment 110B may contain metal lines from a metal-2 layer, or vice versa. The segments 110A and 110B each have a meandrous shape, for example the shape illustrated in FIGS. 3A and 3B. In some embodiments, the meandrous shape may mean that the segments 110A and 110B each contain a plurality of twists and turns, or may be zig-zag shaped.

Figure 4:
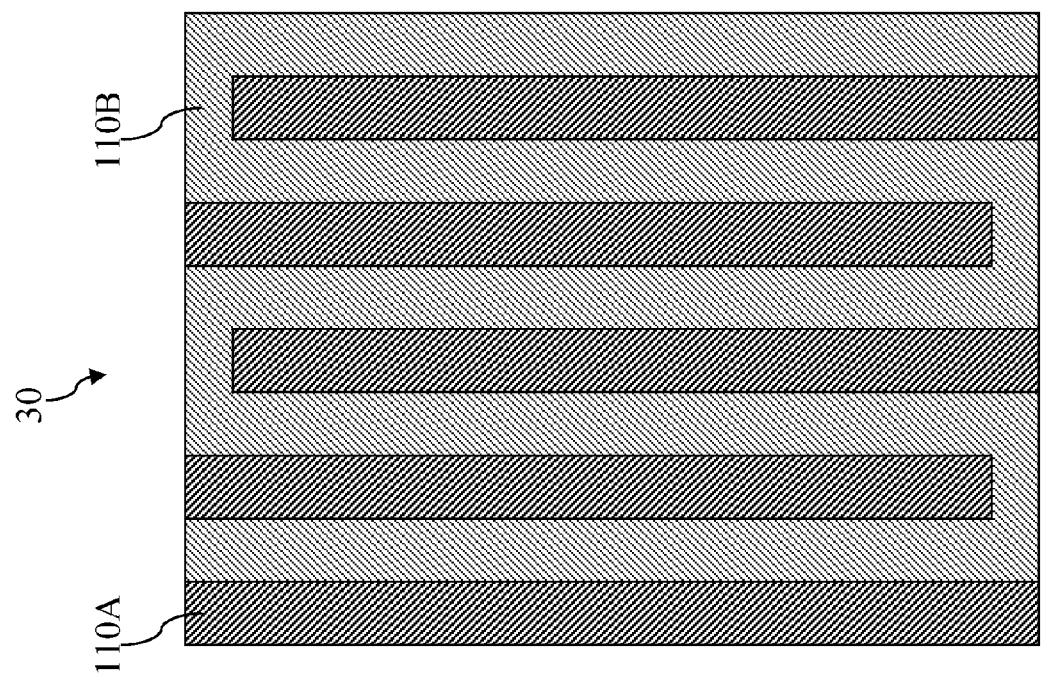

Referring to FIG. 4, a superimposed top view of the segments 110A and 110B is shown according to certain embodiments. The segments 110A and 110B are misaligned (i.e., not aligned) in the top view. Stated differently, the segments 110A and 110B are positionally offset from each other in the top view. In some embodiments, the 110A and 110B approximately complement each other—each of the segments 110A and 110B fills a void of the other. In other embodiments, the 110A and 110B may at least partially overlap with each other in the top view (though they do not physically touch each other). In some embodiments, the segments 110A and 110B also have a collective area that exceeds an area of the inductor structure 80 and therefore "obstruct" the substrate 90 from the "view" of the inductor structure 80. These configurations are implemented to optimize the amount of shielding or isolation provided to the inductor structure 80. In other words, since the inductor structure 80 is completely blocked off from the substrate 90 in certain embodiments, the electromagnetic leakage or interference between the inductor structure 80 and the microelectronic components in the substrate 90 are minimized, thereby improving the performance of the inductor structure 80.

Referring back to FIG. 2, the IC device 30 also includes an underfill layer 120. The underfill layer 120 couples the die 40 and the die 50 together. The underfill layer 120 may contain one or more microbumps (not illustrated herein), which are conductive devices that extend through the underfill layer 120. The microbumps allow for electrical coupling between devices on the die 40 and the devices on the die 50. The underfill layer 120 also contains an electrically insulating material that surrounds the microbumps. For example, the insulating material may contain a dielectric material. The underfill layer 120 has a thickness 130. In some embodiments, the thickness 130 is at least 10 microns. In some other embodiments, the thickness 130 is in a range from about 30 microns to about 50 microns.

The inductor structure 80 is separated from the shielding structure 110 by the underfill layer 120. Thus, the spacing between the inductor structure 80 and the shielding structure 110 is at least as much as the thickness 130. In traditional IC devices, a shielding structure is typically implemented in the same die (and the same interconnect structure) as an inductor (or any other suitable electronic component). As such, the spacing between the inductor and the shielding structure in traditional IC device is typically small, for example a few microns. As discussed above, the relatively small spacing between the inductor and the shielding structure in traditional IC devices may lead to excessive parasitic capacitance, since capacitance is inversely correlated with the distance between two conductive plates.

In comparison, the spacing between the inductor structure 80 and the shielding structure 110 herein is much greater, for example in the range of tens or microns (or more). Consequently, the distance between the two conductive plates (i.e., the inductor structure 80 and the shielding structure 110) is significantly increased, and therefore the parasitic capacitance is greatly reduced. The reduced parasitic capacitance will increase the quality factor of the inductor structure 80 and improve its associated resonant frequency.

Figure 5:
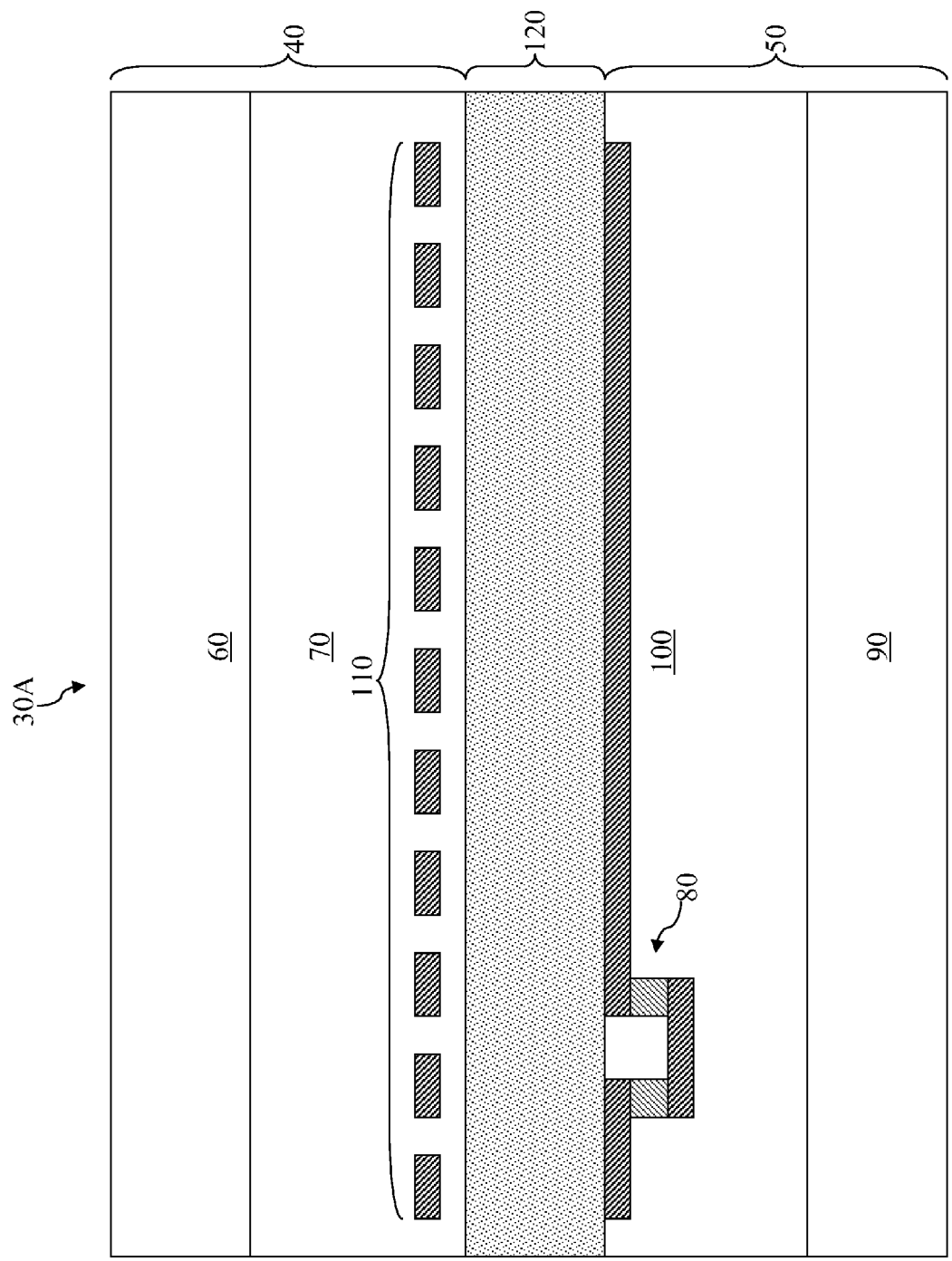
FIGS. 5-8 are cross-sectional views of IC devices according to various aspects of the present disclosure.

FIGS. 5-8 are diagrammatic fragmentary cross-sectional side views of various alternative embodiments of the IC device 30. For the sake of consistency and clarity, similar components throughout FIGS. 2 and 5-8 are labeled the same. Referring to FIG. 5, an IC device 30A includes an interposer die 40 and a silicon die 50 fabricated using a CMOS fabrication process. The interposer die 40 and the silicon die 50 are coupled together through the underfill layer 120. Unlike the IC device 30 of FIG. 2, the IC device 30A implements the shielding structure 110 in the interposer die 40, and implements the inductor structure 80 in the silicon die 50. In further embodiments, the inductor structure 80 and the shielding structure 110 may be implemented in two interposer dies, or implemented in two silicon dies fabricated using the CMOS fabrication process.

Figure 6:
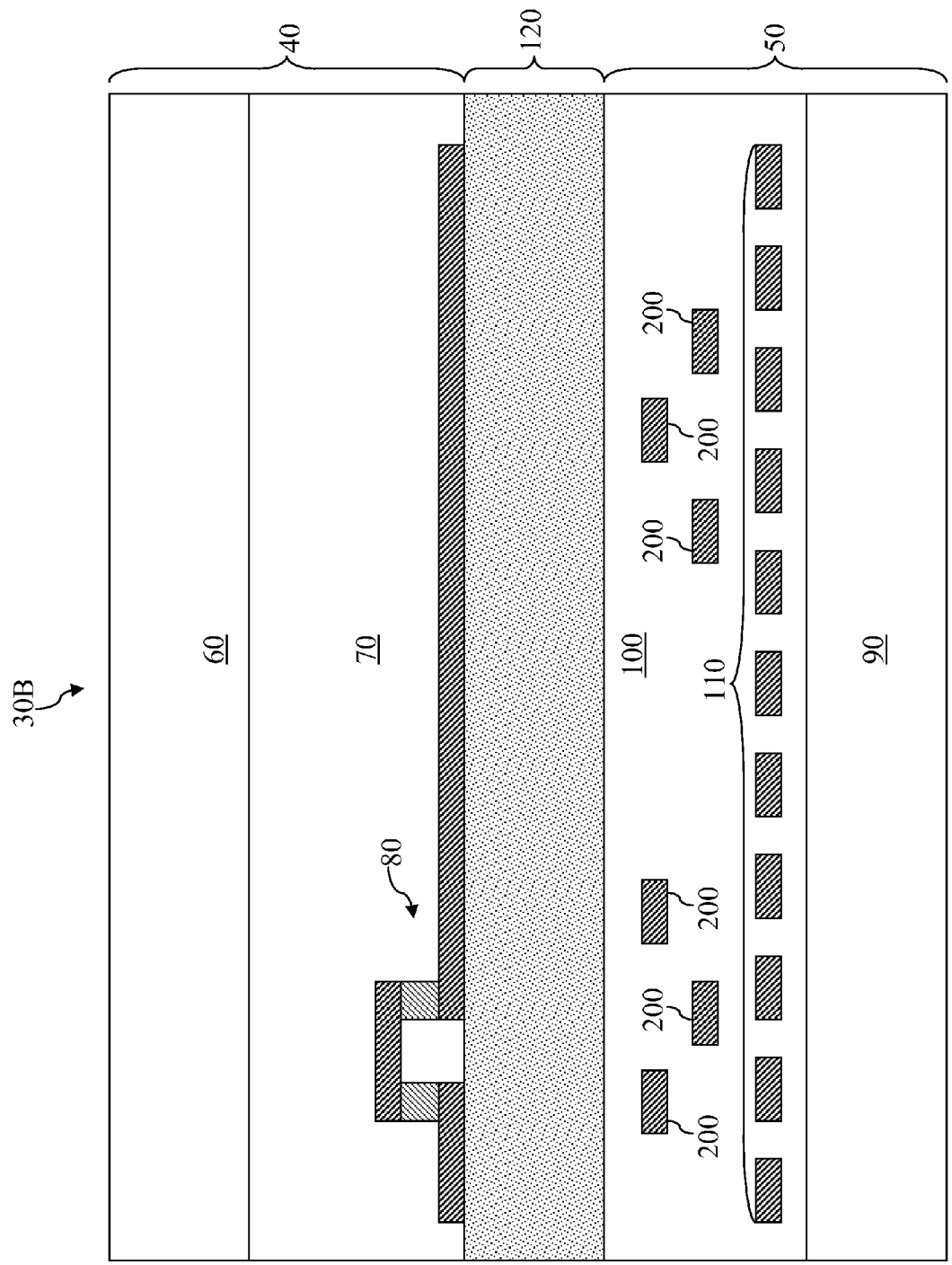

Referring to FIG. 6, an IC device 30B includes an interposer die 40 and a silicon die 50 fabricated using a CMOS fabrication process. The interposer die 40 and the silicon die 50 are coupled together through the underfill layer 120. The IC device 30B also includes a plurality of dummy metal devices 200 in the interconnect structure 100 of the silicon die 50. In some embodiments, the dummy metal devices 200 are used for processing considerations. For example, they may allow process corners to be more easily reached in order to control the yield. It is understood that since the PGS structures herein use thin devices, such as poly or metal gates, they are effective as a meandrous type of shielding structure.

Figure 7:
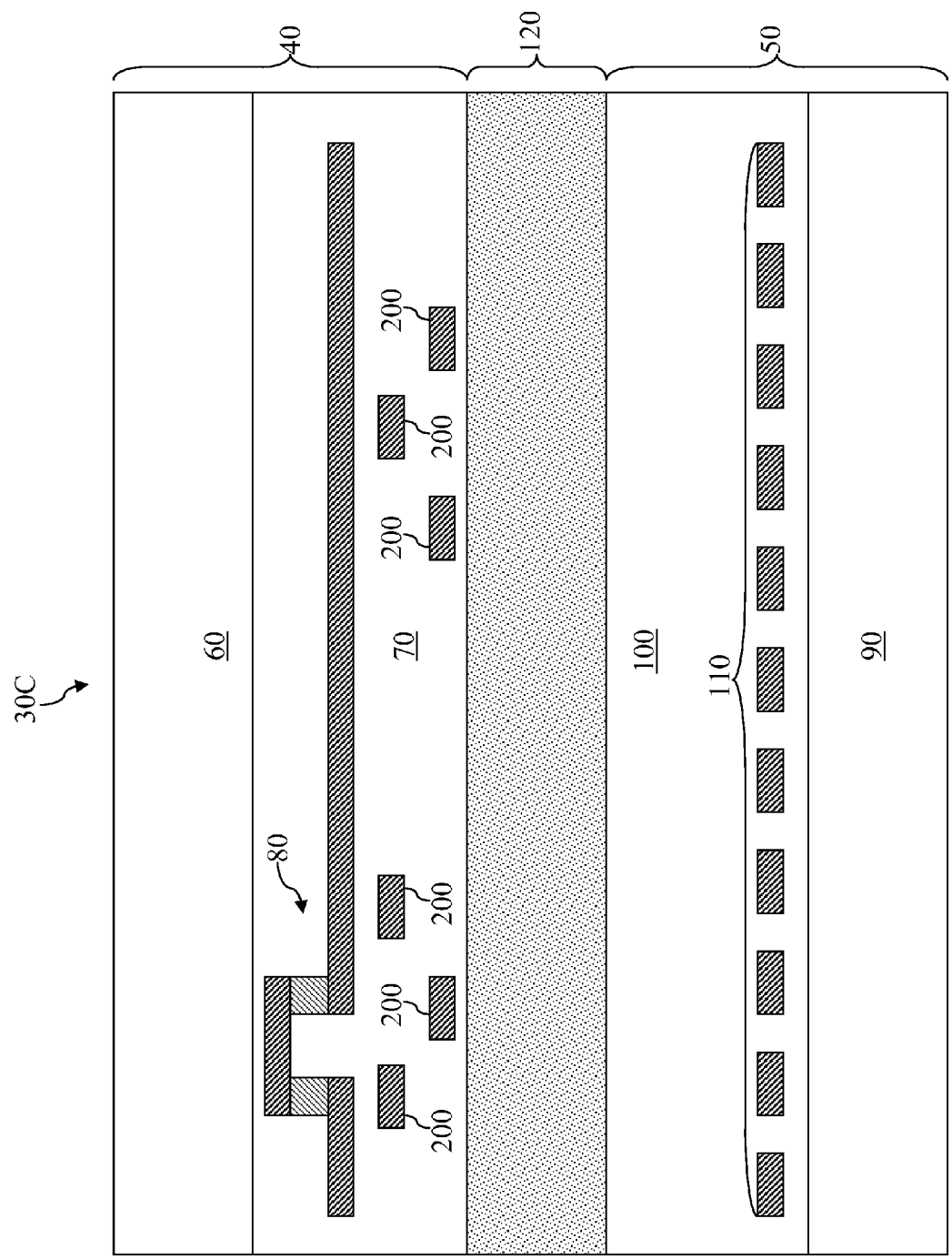

Referring to FIG. 7, an IC device 30C includes an interposer die 40 and a silicon die 50 fabricated using a CMOS fabrication process. The interposer die 40 and the silicon die 50 are coupled together through the underfill layer 120. The IC device 30C also includes a plurality of dummy metal devices 200 in the interconnect structure 70 of the interposer die 40.

Figure 8:
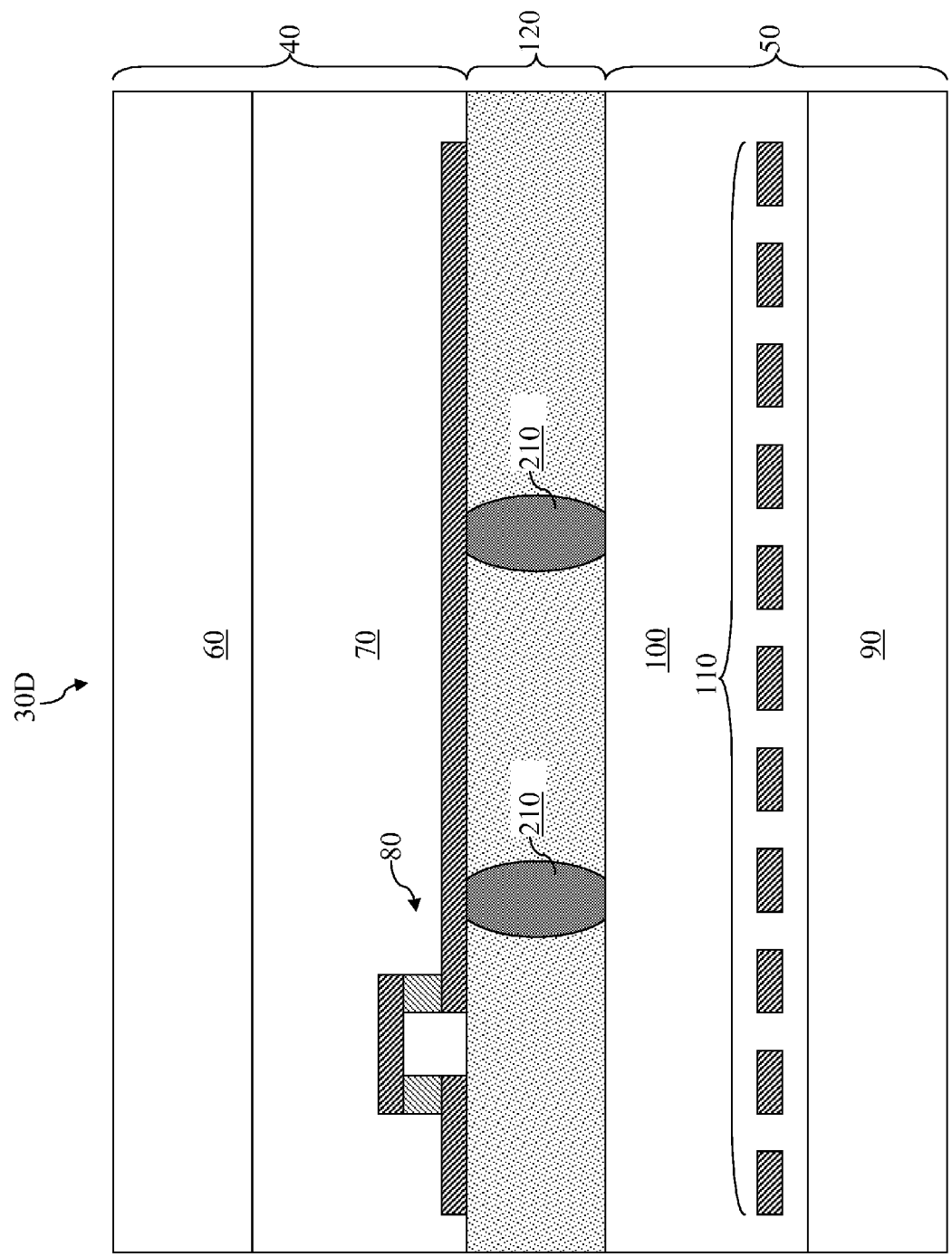
Figure 9:
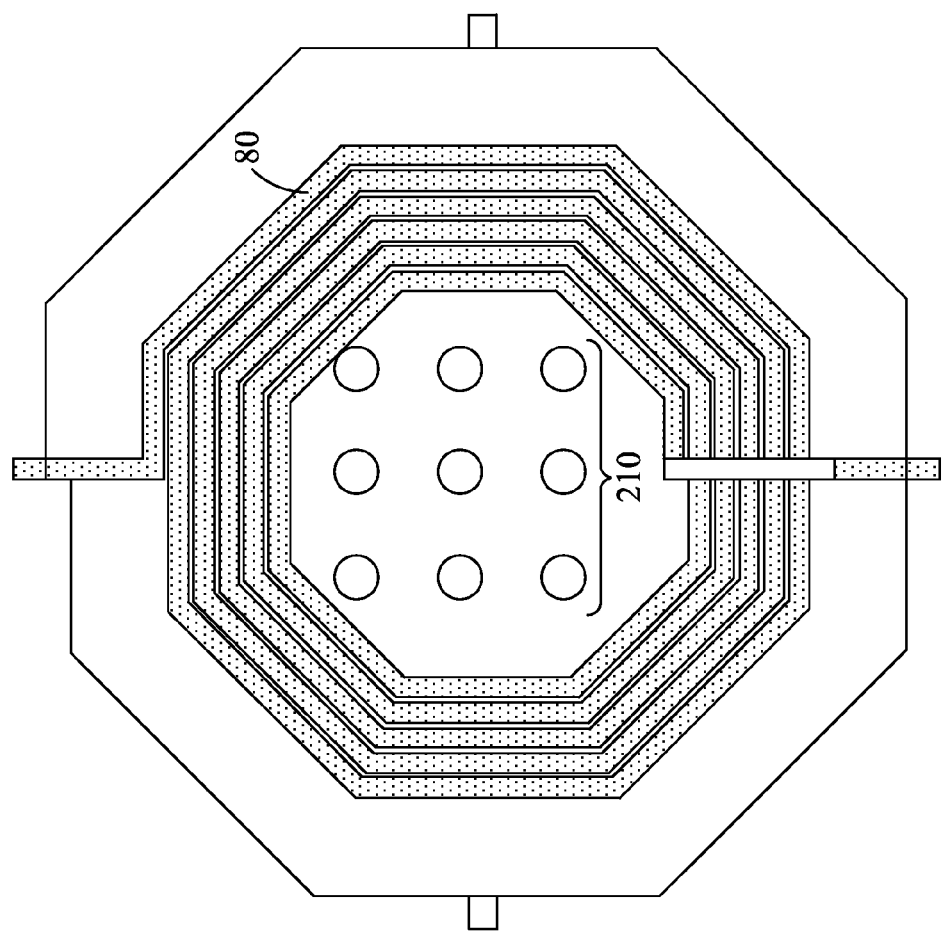
FIG. 9 is a top view of an inductor structure according to various aspects of the present disclosure.

Referring to FIG. 8, an IC device 30D includes an interposer die 40 and a silicon die 50 fabricated using a CMOS fabrication process. The interposer die 40 and the silicon die 50 are coupled together through the underfill layer 120. The IC device 30D also includes a plurality of dummy microbumps 210. In some embodiments, these dummy microbumps 210 are surrounded by the coils of the inductor structure 80 in a top view. An example of such configuration is illustrated in the top view of FIG. 9. The disposition of the microbumps 210 inside (or being surrounded by) the inductor structure 80 improves the performance of the inductor structure 80.

Figure 10:
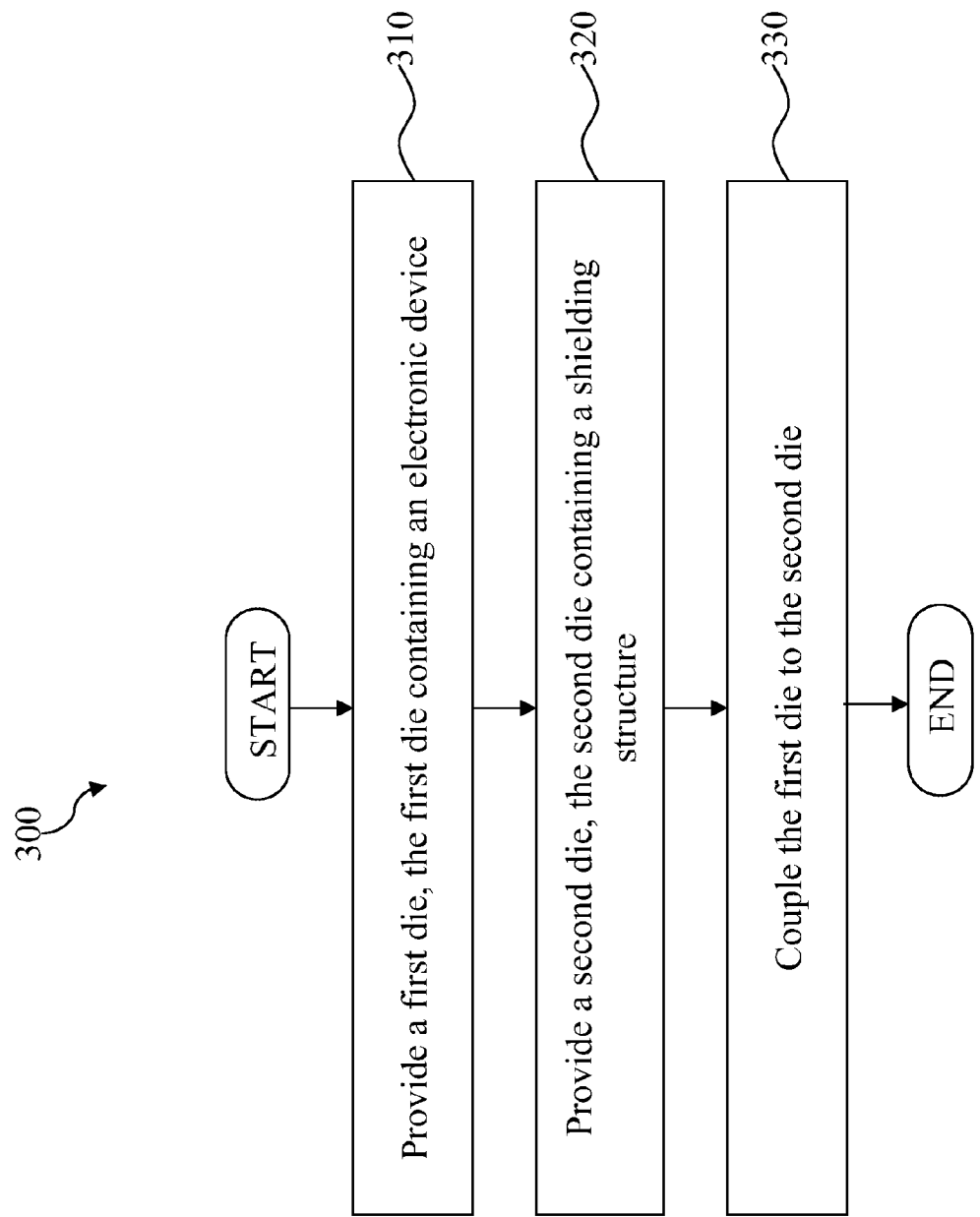
FIG. 10 is a flowchart illustrating a method of fabricating a transformer device according to an embodiment.

FIG. 10 illustrates a flowchart of a method 300 for fabricating an IC device discussed above in FIGS. 2-9 according to various aspects of the present disclosure. The method 300 includes a block 310 in which a first die is provided. The first die contains an electronic device. In some embodiments, the electronic device includes an inductor coil. The method 300 includes a block 320 in which a second die is provided. The second die contains a shielding structure. In some embodiments, the shielding structure includes a PGS structure. The PGS structure may contain multiple segments that each have a meandrous shape. The segments may be positionally-offset (or misaligned) in a top view. The multiple segments may be implemented in different metal layers of an interconnect structure. The method 300 includes a block 330 in which the first die is coupled to the second die. In some embodiments, the first and second dies are coupled together through an underfill layer that contains one or more microbumps. Some of the microbumps may be dummy microbumps and may be surrounded by the inductor coil in a top view. It is understood that the figures discussed herein have been simplified for a better understanding of the inventive concepts of the present disclosure. Accordingly, it should be noted that additional processes may be provided before, during, and after the method 300, and that some other processes may only be briefly described herein.

The shielding structures of the present disclosure discussed above offer advantages over traditional shielding structures. However, it is understood that not all advantages are necessarily discussed herein, other embodiments may offer different advantages, and that no particular advantage is required for all embodiments. One advantage is the reduction of parasitic capacitance. As discussed above, traditional IC devices implement an inductor (or another suitable electronic component, such as transmission lines or transformers) and a shielding structure on the same die, typically in the same interconnect structure. Thus, the effective parasitic capacitor has a short distance separating the conductive plates (i.e., the inductor and the shielding structure). Consequently, the parasitic capacitance may be significant, which may degrade the performance of the inductor, particularly at high frequencies.

In comparison, the inductor structure and the shielding structure of the present disclosure are implemented on two separate dies and are separated by a sufficiently thick underfill layer. In this manner, the distance of the effective parasitic capacitor is greatly increased, thereby reducing the effective parasitic capacitance. The reduction in parasitic capacitance increases the quality factor of the inductor and may improve the resonant frequency of the inductor.

Another advantage of the present disclosure is that the meandrous shielding structure is more effective at providing isolation for the inductor. In embodiments where multiple meandrous segments of the shielding structure are implemented in different layers and misaligned, the collective area of the segments may effectively block off an electromagnetic leakage path between the inductor and the electronic components of the substrate. Therefore, the inductor may be better isolated.

One of the broader forms of the present disclosure involves an apparatus. The apparatus includes: a first die that contains an electronic component; second die that contains a ground shielding structure; and a layer disposed between the first die and the second die, wherein the layer couples the first die and the second die together.

In some embodiments, the electronic component and the ground shielding structure each contain a conductive material; and the electronic component is an inductor coil.

In some embodiments, the first die and the second die each include a silicon substrate or an interposer substrate.

In some embodiments, the interposer substrate includes a dielectric material or a glass material.

In some embodiments, the layer includes an underfill material.

In some embodiments, the layer has a thickness that is at least ten microns.

In some embodiments, the layer contains one or more microbumps.

In some embodiments, at least one of the first and second dies contains one or more dummy metal devices.

In some embodiments, the ground shielding structure device includes a first segment and a second segment; the first and second segments are formed in different layers; the first and second segments each have a meandrous shape; and the first and second segments are positionally offset from one another in a top view.

One of the broader forms of the present disclosure involves a device. The device includes: an inductor coil formed in a first die; a patterned ground shielding (PGS) device formed in a second die separate from the first die; an underfill material located between the first die and the second die.

In some embodiments, one of the first and second dies includes a silicon substrate, and the other one of the first and second dies includes an interposer substrate.

In some embodiments, the silicon substrate includes a plurality of microelectronic devices formed therein; and the interposer substrate includes one of: a dielectric material and a glass material.

In some embodiments, one of the first and second dies includes at least one dummy metal.

In some embodiments, the underfill material includes at least one dummy microbump.

In some embodiments, the dummy microbump is surrounded by the inductor coil in a top view.

In some embodiments, the PGS device contains a first elongate winding portion and a second elongate winding portion that are formed in two separate metal layers, the first elongate winding portion and the second elongate winding portion being misaligned with respect to each other in a top view.

Yet another one of the broader forms of the present disclosure involves a microelectronic device. The microelectronic device includes: a first die that contains a plurality of first interconnect layers, wherein an inductor coil structure is disposed in a subset of the first interconnect layers; a second die that contains a plurality of second interconnect layers, wherein a patterned ground shielding (PGS) structure is disposed in a subset of the second interconnect layers; and an underfill layer disposed between the first and second dies, the underfill layer containing one or more microbumps.

In some embodiments, the first die and the second die each include a substrate that is one of: a silicon substrate and an interposer substrate.

In some embodiments, at least one of the first and second dies contains a plurality of dummy metal components; and the underfill layer contains a plurality of dummy microbumps that are surrounded by the inductor coil structure in a top view.

In some embodiments, the PGS structure includes a first segment and a second segment that are formed in different layers of the second interconnect layers, and wherein the first and second segments each have a meandering shape and are misaligned with each other in a top view.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
a first die that contains an electronic component;
second die that contains a ground shielding structure, wherein the ground shielding structure device includes a first segment and a second segment, and wherein the first and second segments are formed in different layers, wherein the first and second segments each have a meandrous shape, and wherein the first and second segments are positionally offset from one another in a top view; and
a layer disposed between the first die and the second die, wherein the layer couples the first die and the second die together.

2. The apparatus of claim 1, wherein:
the electronic component and the ground shielding structure each contain a conductive material; and
the electronic component is an inductor coil.

3. The apparatus of claim 1, wherein the first die and the second die each include a silicon substrate or an interposer substrate.

4. The apparatus of claim 1, wherein the layer includes an underfill material.

5. The apparatus of claim 1, wherein the layer has a thickness that is at least ten microns.

6. The apparatus of claim 1, wherein the layer contains one or more microbumps.

7. The apparatus of claim 1, wherein at least one of the first and second dies contains one or more dummy metal devices.

8. The apparatus of claim 3, wherein the interposer substrate includes a dielectric material, a high resistance material, or a glass material.

9. A device, comprising:
an inductor coil formed in a first die;
a patterned ground shielding (PGS) device formed in a second die separate from the first die, wherein the PGS device contains a first elongate winding portion and a second elongate winding portion; and
an underfill material located between the first die and the second die.

10. The device of claim 9, wherein one of the first and second dies includes a silicon substrate, and the other one of the first and second dies includes an interposer substrate.

11. The device of claim 9, wherein one of the first and second dies includes at least one dummy metal.

12. The device of claim 9, wherein the underfill material includes at least one dummy microbump.

13. The device of claim 9, wherein the first elongate winding portion and the second elongate winding portion are formed in two separate metal layers, the first elongate winding portion and the second elongate winding portion being misaligned with respect to each other in a top view.

14. The device of claim 10, wherein:
the silicon substrate includes a plurality of microelectronic devices formed therein; and
the interposer substrate includes one of: a dielectric material and a glass material.

15. The device of claim 12, wherein the dummy microbump is surrounded by the inductor coil in a top view.

16. A microelectronic device, comprising:
a first die that contains a plurality of first interconnect layers, wherein an inductor coil structure is disposed in a subset of the first interconnect layers;
a second die that contains a plurality of second interconnect layers, wherein a patterned ground shielding (PGS) structure is disposed in a subset of the second interconnect layers; and
an underfill layer disposed between the first and second dies, the underfill layer containing one or more microbumps.

17. The microelectronic device of claim 16, wherein the first die and the second die each include a substrate that is one of: a silicon substrate and an interposer substrate.

18. The microelectronic device of claim 16, wherein:
at least one of the first and second dies contains a plurality of dummy metal components; and
the underfill layer contains a plurality of dummy microbumps that are surrounded by the inductor coil structure in a top view.

19. The microelectronic device of claim 16, wherein the PGS structure includes a first segment and a second segment that are formed in different layers of the second interconnect layers, and wherein the first and second segments each have a meandering shape and are misaligned with each other in a top view.

* * * * *